US009292716B2

(12) United States Patent
Winoto et al.

(10) Patent No.: US 9,292,716 B2
(45) Date of Patent: *Mar. 22, 2016

(54) METHOD AND APPARATUS FOR DETECTING AN OUTPUT POWER OF A RADIO FREQUENCY TRANSMITTER USING A MULTIPLIER CIRCUIT

(71) Applicant: Marvell World Trade Ltd., St. Michael (BB)

(72) Inventors: Renaldi Winoto, Danville, CA (US); David M. Signoff, Santa Clara, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/669,418

(22) Filed: Mar. 26, 2015

(65) Prior Publication Data
US 2015/0199543 A1 Jul. 16, 2015

Related U.S. Application Data

(63) Continuation of application No. 13/713,328, filed on Dec. 13, 2012, now Pat. No. 8,994,362.

(60) Provisional application No. 61/720,844, filed on Oct. 31, 2012, provisional application No. 61/576,306, filed on Dec. 15, 2011.

(51) Int. Cl.
*G06G 7/163* (2006.01)
*G01R 17/16* (2006.01)
*H03D 7/14* (2006.01)
*G06G 7/16* (2006.01)
*G01R 21/00* (2006.01)

(52) U.S. Cl.
CPC .............. *G06G 7/163* (2013.01); *G01R 17/16* (2013.01); *G01R 21/00* (2013.01); *G06G 7/16* (2013.01); *H03D 7/1441* (2013.01); *H03D 7/1458* (2013.01); *H03D 7/1466* (2013.01); *H03D 2200/0043* (2013.01)

(58) Field of Classification Search
CPC . H03G 1/0005; H03G 3/3068; H03G 3/3042; H03H 11/1291; H03H 11/04; H03H 11/54; H03H 11/20; H01F 27/42; H03L 7/0812; H03L 7/087; H03L 7/12; H03L 7/16; H03B 5/364; H03B 5/1212; H03B 2200/0038; H03D 2200/009; H03D 5/00; H03F 1/3211; H03F 1/26; H03F 3/68; H03F 2200/331; H03F 3/2173; H03F 2200/451; H03F 2200/453; H03F 2200/456; H03F 2200/91; H03F 2203/45241; H03F 2203/45356; H03F 2203/45366; H03F 3/191; H03F 1/0261; H03F 3/189; H03F 3/245; G01R 17/16; G01R 21/00; G01R 33/3607; G01S 7/023; G06G 7/163; G06F 17/5063
See application file for complete search history.

(56) References Cited

U.S. PATENT DOCUMENTS 3,900,823 A * 8/1975 Sokal .................... H03F 1/0216
330/129
4,538,300 A 8/1985 Richards, Jr.
(Continued)

FOREIGN PATENT DOCUMENTS

EP 0951138 A1 10/1999
EP 2302787 A1 3/2011

OTHER PUBLICATIONS

Notification of Transmittal of the International Search Report and the Written Opinion of the International Searching Authority, or the Declaration dated Mar. 6, 2013 in reference to PCT/US2012/069491 (11 pgs).

*Primary Examiner* — Vinh Hguyen

(57) ABSTRACT

A power detection circuit configured to detect an output power of a radio frequency transmitter. The power detection circuit includes a multiplier circuit configured to multiply a first differential input signal and a second differential input signal. The first differential input signal corresponds to a radio frequency signal to be amplified by the radio frequency transmitter. The second differential signal corresponds to an output signal as amplified by an amplifier of the radio frequency transmitter. A bias circuit is configured to generate a bias signal. A differential amplifier is configured to generate, based on the bias signal and the first differential signal and the second differential signal as multiplied by the multiplier circuit, an indication of the output power of the amplifier of the radio frequency transmitter.

19 Claims, 6 Drawing Sheets

(56) References Cited

U.S. PATENT DOCUMENTS

| | | | |
|---|---|---|---|
| 6,983,135 B1 | 1/2006 | Tsai et al. | |
| 8,994,362 B2 * | 3/2015 | Winoto | H03D 7/1441 324/123 C |
| 2003/0161411 A1 * | 8/2003 | McCorkle | G01S 7/023 375/295 |
| 2003/0169089 A1 | 9/2003 | Manku et al. | |
| 2003/0203722 A1 | 10/2003 | Karlquist et al. | |
| 2006/0014509 A1 | 1/2006 | Xu et al. | |
| 2006/0199562 A1 | 9/2006 | Taylor | |

* cited by examiner

METHOD AND APPARATUS FOR DETECTING AN OUTPUT POWER OF A RADIO FREQUENCY TRANSMITTER USING A MULTIPLIER CIRCUIT

CROSS-REFERENCE TO RELATED APPLICATIONS

The present disclosure is a continuation of U.S. patent application Ser. No. 13/713,328 (now U.S. Pat. No. 8,994, 362), filed on Dec. 13, 2012, which claims the benefit of U.S. Provisional Application No. 61/576,306, filed on Dec. 15, 2011 and U.S. Provisional Application No. 61/720,844, filed on Oct. 31, 2012. The entire disclosures of the applications referenced above are incorporated herein by reference.

FIELD

The present disclosure relates to radio frequency (RF) transmitters, and more particularly to RF power detection circuit for RF transmitters.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Some radio frequency (RF) transmitters require accurate control of transmitted output power. For example, many RF transmitters need to comply with FCC regulations and wireless standards. Control of output power can be accomplished using an open loop or closed loop control system. In open loop control systems, the RF transmitter relies on accurate gain steps within the transmitter. In closed loop control systems, output power is measured and gain is adjusted accordingly.

An RF power detection circuit is an integral part of any RF transmitter closed-loop power-control system. The RF power detection circuit measures absolute transmitted power. This measurement is preferably independent of variation in temperature, device characteristics due to process spread, and load/antenna impedance.

Some RF power detection circuits assume a resistance value of an output load such as an antenna, measure output voltage and calculate output power based the output voltage squared divided by the resistance value. However, the resistance value of the load such as the antenna may vary during operation. For example, the resistance value of the antenna may be affected when the antenna is near or comes in contact with other objects. As can be appreciated, the RF power calculation will be adversely affected due to the difference between the actual resistance value of the antenna and the assumed resistance value.

SUMMARY

A circuit includes a multiplier circuit including a mixer configured to multiply a first differential input signal and a second differential input signal. The mixer includes a plurality of transistors including control terminals. The control terminals of the plurality of transistors receive a bias signal and the first differential input signal. A bias circuit is configured to generate the bias signal. The bias signal generated by the bias circuit is based on a voltage threshold of one of the plurality of transistors and a product of constant reference current and a bias resistance.

In other features, the mixer includes a Gilbert cell mixer. The bias circuit is configured to generate the bias signal such that a conversion gain of the mixer is substantially constant regardless of variations in process and temperature. The bias circuit includes a current source configured to generate the constant reference current, a bias resistance having the bias resistance and including one end in communication with the first current source, and a first transistor including a first terminal and a control terminal in communication with one end of the bias resistance. The bias signal is generated at a node between the bias resistance and the current source.

A method of operating a circuit includes, using a mixer, multiplying a first differential input signal and a second differential input signal, wherein the mixer comprises a plurality of transistors including control terminals. The control terminals of the plurality of transistors receive a bias signal and the first differential input signal. The method further includes generating the bias signal based on a voltage threshold of one of the plurality of transistors and a product of constant reference current and a bias resistance.

In other features, the mixer includes a Gilbert cell mixer. Generating the bias signal includes generating the bias signal such that a conversion gain of the mixer is substantially constant regardless of variations in process and temperature. The bias signal is generated at a node between a bias resistance and a current source.

Further areas of applicability of the present disclosure will become apparent from the detailed description, the claims and the drawings. The detailed description and specific examples are intended for purposes of illustration only and are not intended to limit the scope of the disclosure.

DESCRIPTION

Figure 1:
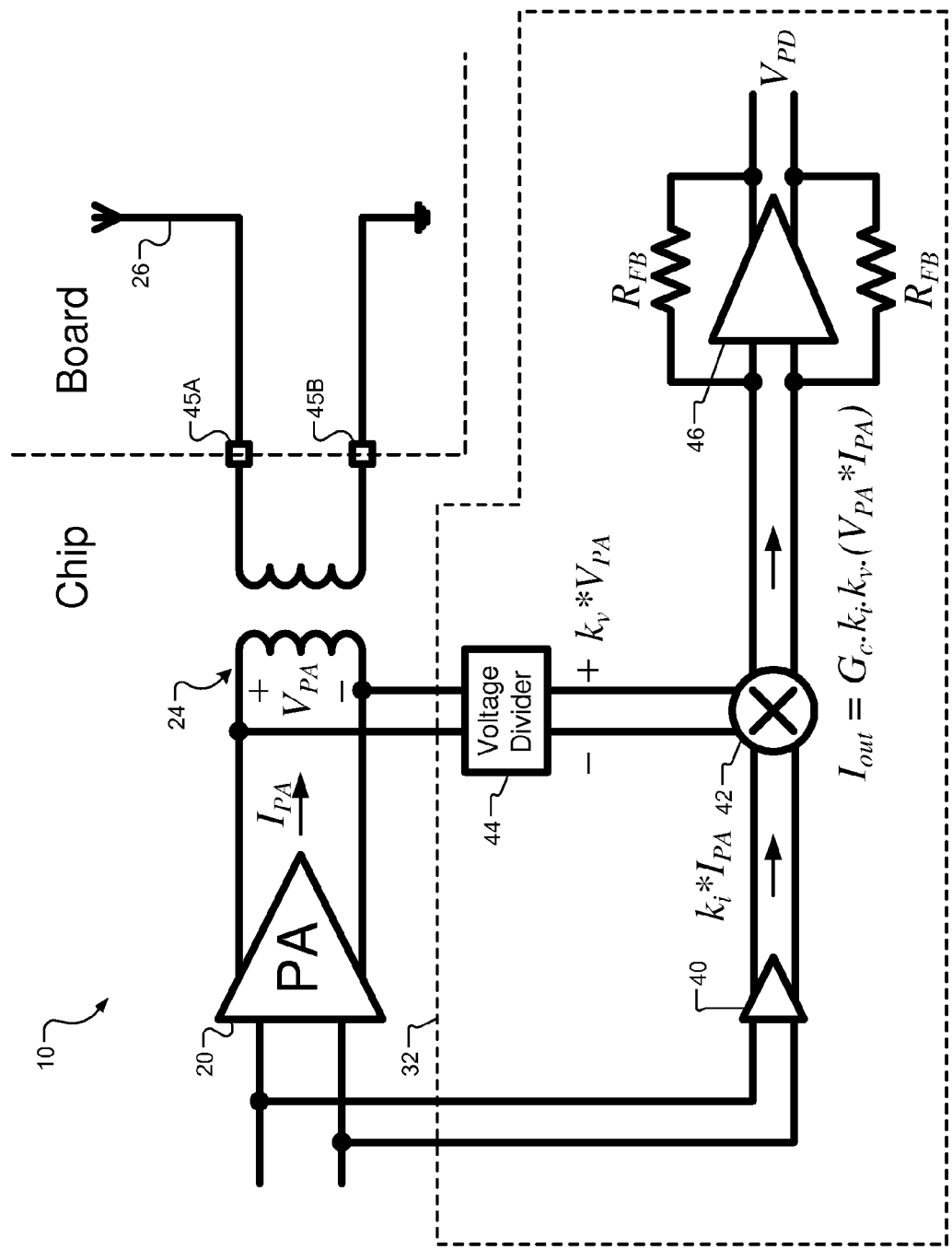
FIG. 1 is a functional block diagram and electrical schematic of an example of an RF power detection circuit according to the prior art.

Referring now to FIG. 1, part of an output circuit 10 of a prior art transmitter is shown. The output circuit 10 includes a power amplifier (PA) 20 that receives a radio frequency (RF) signal to be amplified and transmitted. The PA 20 outputs an amplified RF signal to a primary side of a transformer 24. One end of a secondary side of the transformer 24 is connected to an antenna 26, which may be arranged on a printed circuit board (PCB). Another end of the secondary side of the transformer 24 is connected to a reference potential such as ground. In this example, the antenna is the load, which has a load impedance.

The output circuit 10 also includes an RF detection circuit 32 that detects an output power level of the PA 20. The RF detection circuit 32 includes an amplifier 40 that receives and amplifies inputs to the PA 20 and outputs an amplified signal to first inputs of a multiplier circuit 42. A voltage divider 44 is connected to outputs of the PA 20 (or to nodes 45A and 45B on the secondary side of the transformer 24) and outputs signals to second inputs of the multiplier circuit 42. Outputs of the multiplier circuit 42 are connected to inputs of an amplifier 46, which has first and second feedback resistances $R_{FB}$ connected to respective inputs and outputs of the amplifier 46. The amplifier 46 outputs a power detect voltage signal $V_{PD}$, which is based on detected output power.

The transmitted RF power is measured by multiplying the output voltage and current of the PA 20. The result is independent of load/antenna impedance (R) or voltage standing wave ratio (VSWR). The output voltage of the PA 20 is sensed through the voltage divider 44 ($k_v$*VPA). The output current of the PA 20 is replicated by using a scaled down replica PA ($k_I$*$I_{PA}$).

Figure 2:
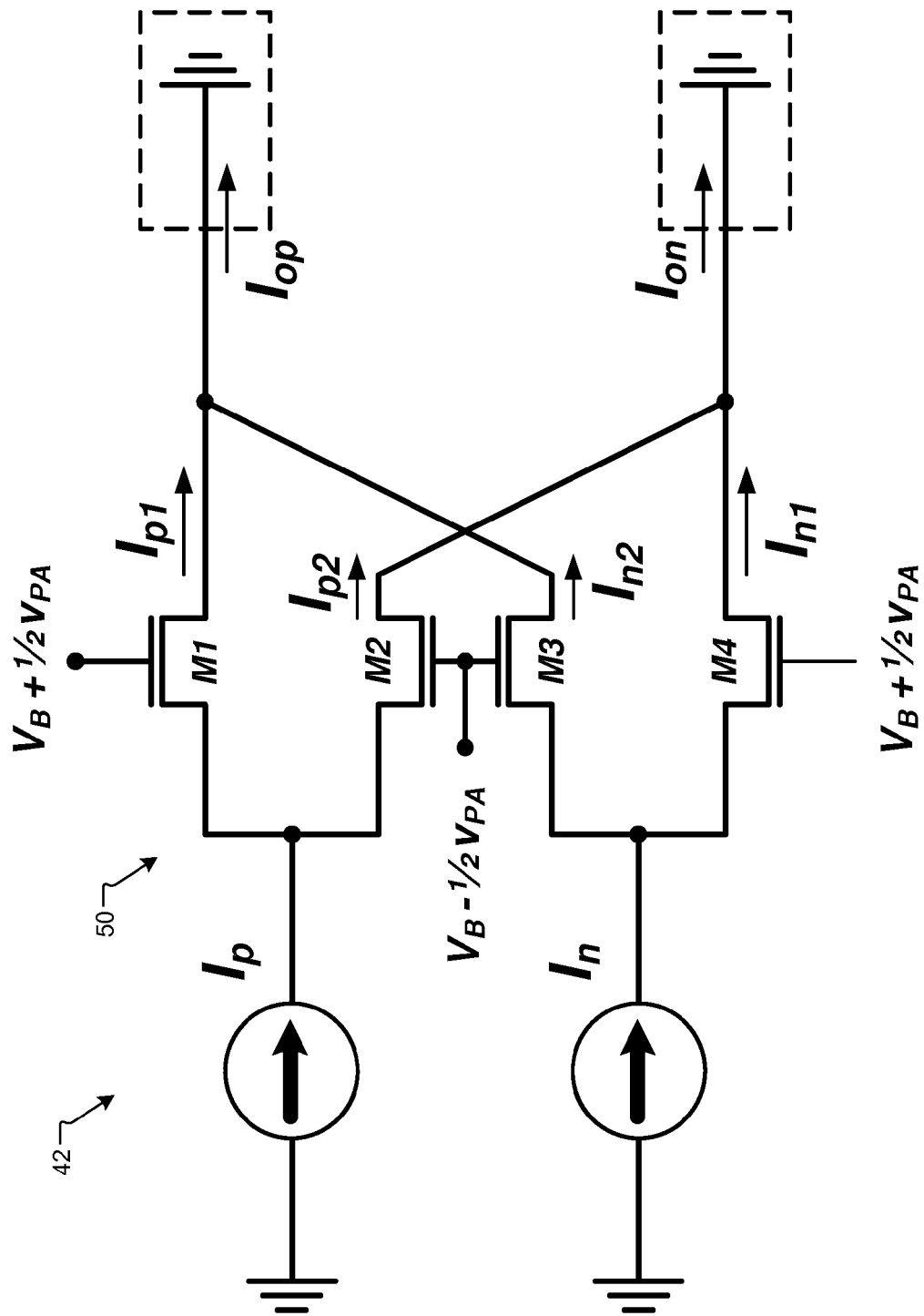
FIG. 2 is a functional block diagram and electrical schematic of an example of a multiplier circuit.

In FIG. 2, an example of the prior art multiplier circuit 42 is shown. The multiplier circuit 42 includes a mixer 50, such as a Gilbert cell mixer, including transistors M1, M2, M3, and M4. First terminals of transistors M1 and M2 receive current $I_p$. First terminals of transistors M3 and M4 receive current $I_n$. Control terminals of transistors M2 and M3 receive a first bias signal $V_B$ and the sensed output voltage $V_{PA}$ (or $V_B - \frac{1}{2} V_{PA}$). Control terminals of transistors M1 and M4 receive the bias signal $V_B$ and the sensed output voltage $V_{PA}$ (or $V_B + \frac{1}{2} V_{PA}$). A second terminal of transistor M3 is connected to a second terminal of transistor M1. A second terminal of transistor M2 is connected to a second terminal of transistor M4.

The multiplier circuit 42 has a conversion gain $G_c$. The mixer 50 performs V*I multiplication. Transistors M1 thru M4 are biased in the linear region. Current $I_p$ divides into two parts, $I_{p1}$ and $I_{p2}$. The ratio depends on the admittances of transistors M1 and M2 (gds1 and gds2). Similarly, current $I_n$ is also divided into two parts, $I_{n1}$ and $I_{n2}$, depending on gds3 and gds4. While a virtual GND termination is assumed for ease of derivation, it is not necessary.

$$I_{p1} = \frac{g_{ds1}}{g_{ds1} + g_{ds2}} \cdot I_p = \frac{\left(V_B + \frac{1}{2}V_{PA} - V_T\right)}{2(V_B - V_T)} \cdot I_p$$

$$I_{out} = I_{op} - I_{on} = \frac{V_{PA} \cdot (I_p - I_n)}{2 \cdot (V_B - V_T)}$$

From FIG. 1, the output (voltage) of the power detection circuit is equal to:

$$V_{PD} = k_V \cdot k_I \cdot G_c \cdot (V_{PA} \cdot I_{PA}) \cdot R_{FB}$$

From FIG. 2, the multiplier conversion gain $G_c$ is:

$$G_c = \frac{1}{2(V_B - V_T)}$$

Therefore the output of the power detection circuit is equal to:

$$V_{PD} = \frac{k_V \cdot k_I \cdot (V_{PA} \cdot I_{PA}) \cdot R_{FB}}{2 \cdot (V_B - V_T)}$$

The value of the on-chip resistance $R_{FB}$ depends on temperature and process variation (manufacturing). MOS threshold voltage $V_T$ also depends on temperature and process variation (manufacturing). $k_v$ and $k_I$ (PA voltage and current division ratio) can be accomplished using a ratioed Gilbert cell, which is independent of temperature, process and load impedance.

According to the present disclosure, ($V_B - V_T$) is set equal to $I_{ref}$* $R_{bias}$. Resistors $R_{FB}$ and $R_{bias}$ can be implemented as scaled versions of each other, e.g. $R_{FB} = A * R_{bias}$. The ratio of resistances A remains constant and independent of process and temperature variation, therefore the output of the power detector is:

$$V_{PD} = \frac{k_V \cdot k_I \cdot (V_{PA} \cdot I_{PA}) \cdot R_{FB}}{2 \cdot I_{ref} \cdot R_{bias}} = \frac{1}{I_{ref}} \cdot \frac{R_{FB}}{R_{bias}} \cdot \frac{k_V \cdot k_I}{2} \cdot (V_{PA} \cdot I_{PA})$$

The constant reference current $I_{ref}$ does not depend on process or temperature. The constant reference current $I_{ref}$ is usually already available on-chip. The constant reference current $I_{ref}$ can be generated by using a combination of a bandgap voltage and an external high-precision resistance.

Figure 3:
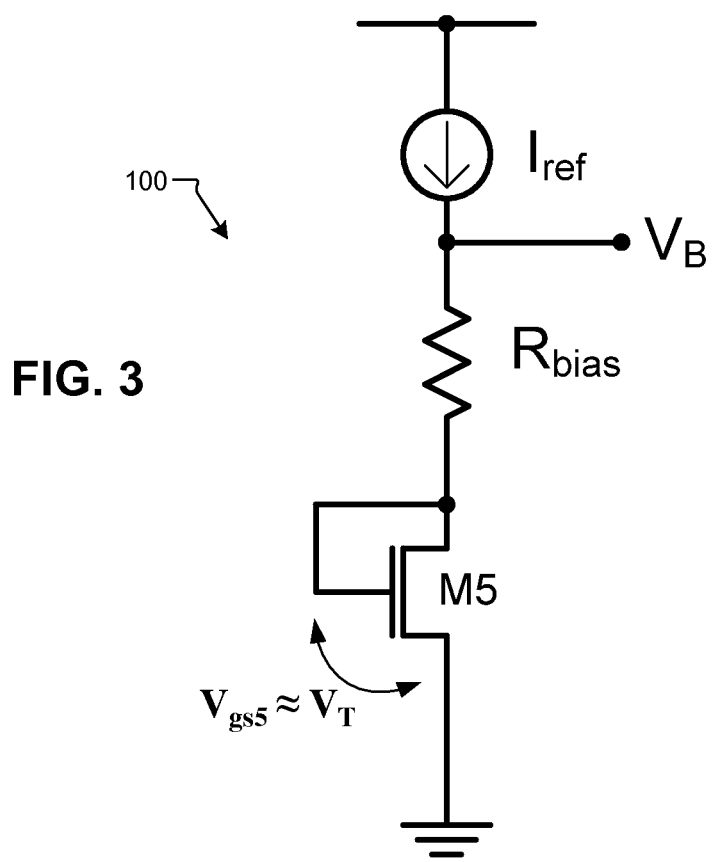
FIG. 3 is a functional block diagram and electrical schematic of an example of a bias circuit according to the present disclosure.

Referring now to FIG. 3, a bias circuit 100 for generating a bias voltage $V_B = V_T + I_{ref} * R_{bias}$ is shown. The bias circuit 100 includes a current source $I_{ref}$ that is connected to one end of a bias resistance $R_{bias}$. Another end of the resistance $R_{bias}$ is connected to a first terminal and a control terminal of a transistor M5. A second terminal of the transistor M5 is connected to a reference potential such as ground. Assuming:

$V_{gs5} = V_T + V_I$;

If $V_{dsat5} \ll V_T$;

Then $V_{gs5} \approx V_T$

This can be done by biasing the transistor M5 with a very low current density. The transistor M5 is preferably a scaled version of transistors M1-M4 for best matching.

Figure 4:
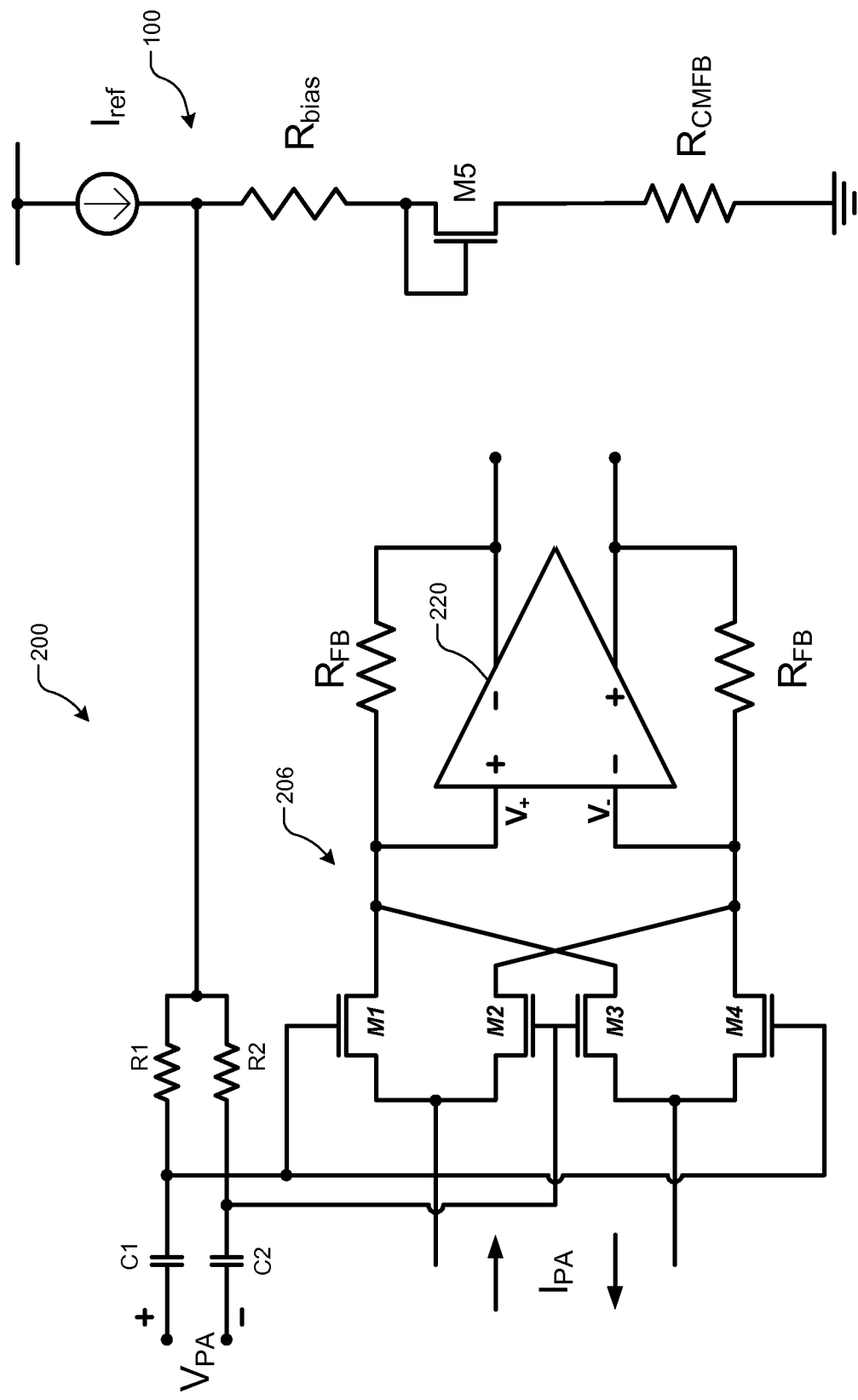
FIG. 4 is a functional block diagram and electrical schematic of an example of a multiplier circuit including a bias circuit according to the present disclosure.
Figure 5:
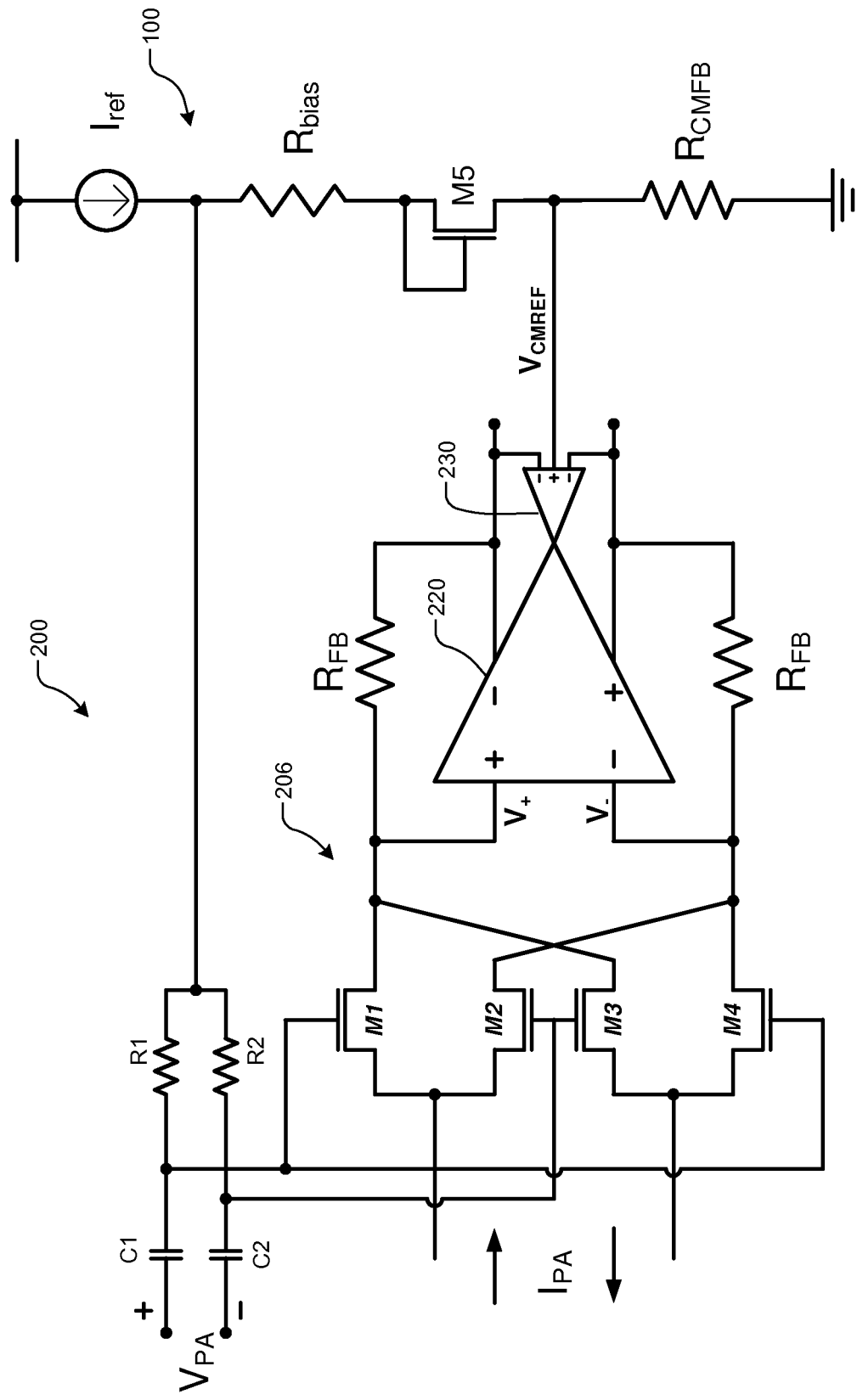
FIG. 5 is a functional block diagram and electrical schematic of another example of a multiplier circuit including a bias circuit according to the present disclosure.

Referring now to FIGS. 4 and 5, an example of the multiplier circuit 200 according to the present disclosure is shown. In FIG. 4, the multiplier circuit 200 includes a mixer 206, such as a Gilbert cell, with transistors M1, M2, M3, and M4. The sampled voltage $V_{PA}$ is connected to first terminals of capacitances $C_1$ and $C_2$. Second terminals of the capacitances $C_1$ and $C_2$ are connected to control terminals of transistors M1, M2, M3, and M4 and to first terminals of resistances $R_1$ and $R_2$. Second terminals of the resistances $R_1$ and $R_2$ provide a bias voltage $V_B$ to the bias circuit 100. First terminals of first and second transistors M1 and M2 and third and fourth transistors M3 and M4 are connected to $I_{PA}$. A second terminal of transistor M3 is connected to a second terminal of transistor M1. A second terminal of transistor M2 is connected to a second terminal of transistor M4.

An amplifier 220 has a non-inverting input connected to the second terminals of the transistors M1 and M3 and to one end of a first feedback resistance $R_{FB}$. The amplifier 220 has an inverting input connected to the second terminals of the transistors M2 and M4 and to one end of a second feedback resistance $R_{FB}$. An inverting output of the amplifier 220 is connected to another end of the first feedback resistance $R_{FB}$ and to a first inverting input of an amplifier 230. A non-inverting output of the amplifier 220 is connected to another end of the second feedback resistance $R_{FB}$ and to a second inverting input of the amplifier 230. In FIG. 5, a common mode input of the amplifier 230 is connected to a second terminal of the transistor M5 and one end of a common mode feedback resistance $R_{CMFB}$.

Transistors M1-M4 are biased with a constant voltage $(V_{gs}-V_T)$. The circuit accommodates a non-zero common-mode input voltage level. $I_{ref}*R_{CMFB}$ sets the common-mode voltage reference. A common-mode feedback amplifier sets $V^+=V^-=V_{CMREF}$. Therefore, transistors M1-M4 are still biased with $(V_{gs}-V_T)=I_{ref}*R_{bias}$.

While the preceding discussion involved a power detector using a passive mixer, the present disclosure can also use an active mixer as well. The active mixer transistors may be biased with a constant overdrive voltage=$I_{ref}*R$. As can be appreciated, while the foregoing description relates to RF detection circuits, the multiplier circuit can be used in other systems. Additionally, the input does not have to correspond to voltage and current delivered to a load.

PA load impedance is unknown and can vary with the environment $Z_L=|Z|\cdot e^{-j\phi}$. Knowing the value of load impedance is useful because PA output matching can be optimized to allow the PA to operate most efficiently. PA load impedance can be measured if we have the following two measurements:

$$P_o=V_{PA}*I_{PA}$$

$$V_{sq}=V_{PA}*V_{PA}=V_{PA}*I_{PA}*|Z|*e^{-j\phi}$$

$|Z|$ and $\phi$ can be solved using these two measurements. The voltage $V_{sq}$ can be generated in multiple ways, one of which is shown in FIG. 6.

Figure 6:
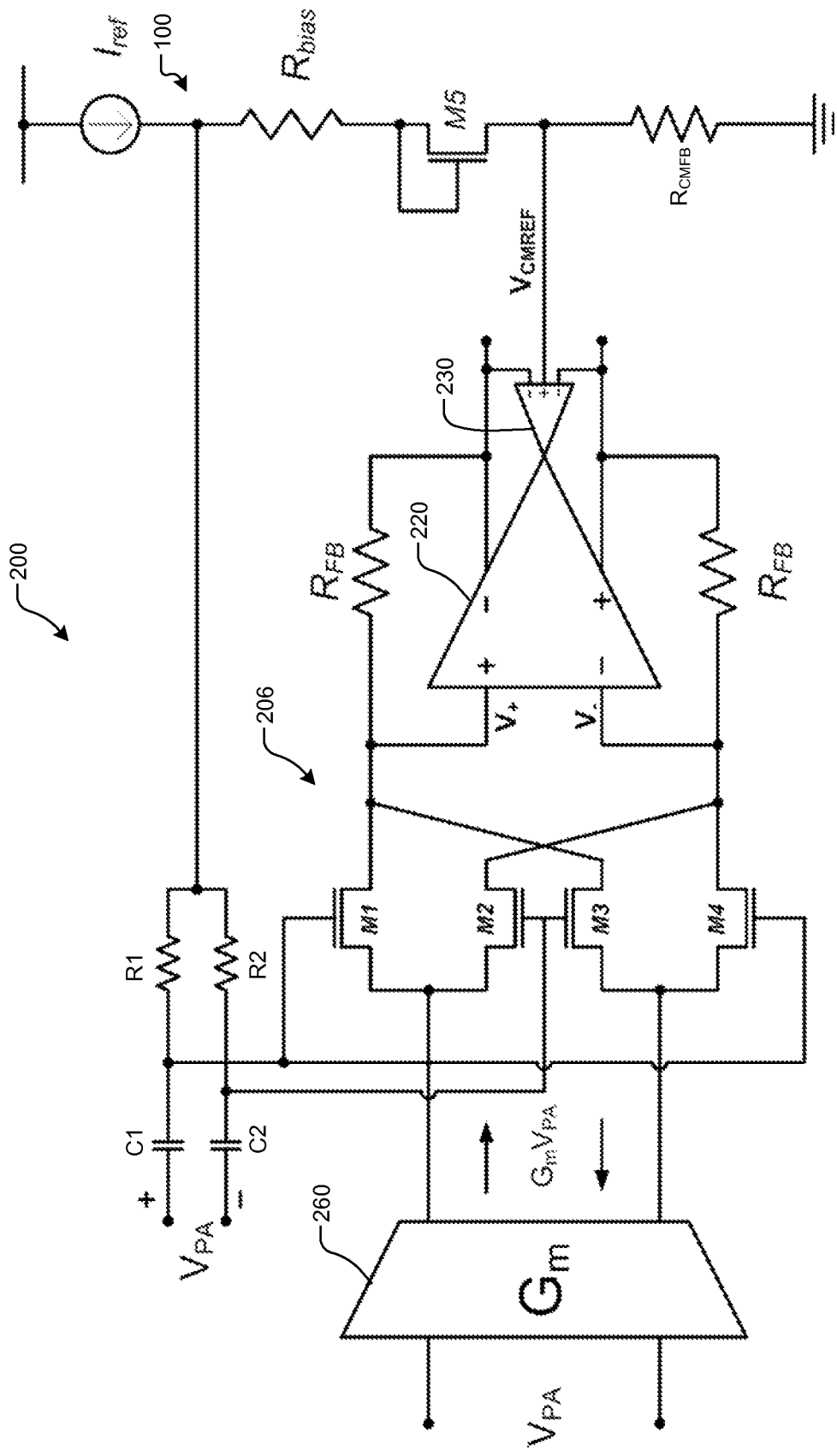
FIG. 6 is a functional block diagram and electrical schematic of another example of a multiplier circuit including a bias circuit according to the present disclosure.

Referring now to FIG. 6, the voltage $V_{PA}$ is input to a transconductance amplifier 260, which receives $V_{PA}$. The transconductance amplifier 260 transforms a voltage input to a current output. The transconductance amplifier 260 generates an output current $G_m V_{PA}$, which is input to the first terminals of the transistors M1 and M2 and transistors M3 and M4 instead of $I_{PA}$ as in FIGS. 4 and 5.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A power detection circuit configured to detect an output power of a radio frequency transmitter, the power detection circuit comprising:
    a multiplier circuit configured to multiply a first differential input signal and a second differential input signal, wherein (i) the first differential input signal corresponds to a radio frequency signal to be amplified by the radio frequency transmitter, and (ii) the second differential signal corresponds to an output signal as amplified by an amplifier of the radio frequency transmitter;
    a bias circuit configured to generate a bias signal; and
    a differential amplifier configured to generate, based on (i) the bias signal and (ii) the first differential signal and the second differential signal as multiplied by the multiplier circuit, an indication of the output power of the amplifier of the radio frequency transmitter.

2. The power detection circuit of claim 1, wherein:
the multiplier circuit includes a mixer, wherein the mixer includes a plurality of transistors, and wherein each of the plurality of transistors includes a control terminal in communication with (i) the bias signal and (ii) the first differential signal.

3. The power detection circuit of claim 2, wherein:
to generate the bias signal, the bias circuit is configured to generate the bias signal further based on a voltage threshold of one of the plurality of transistors.

4. The power detection circuit of claim 3, wherein:
the bias circuit includes a bias resistance; and
to generate the bias signal, the bias circuit is configured to generate the bias signal further based on a product of (i) a constant reference current and (ii) the bias resistance.

5. The power detection circuit of claim 1, wherein:
the bias circuit comprises
    a current source configured to generate a constant reference current,
    a bias resistance having a bias resistance and including one end in communication with the current source, and
    a first transistor including a first terminal and a control terminal each in communication with one end of the bias resistance; and
to generate the bias signal, the bias circuit is configured to generate the bias signal at a node between the bias resistance and the current source.

6. The power detection circuit of claim 1, wherein:
the bias circuit is connected to the multiplier circuit via a first resistance and a second resistance; and
the first resistance and the second resistance provide a bias voltage to the bias circuit.

7. The power detection circuit of claim 1, further comprising:
    a common mode feedback amplifier connected to an output of the differential amplifier, wherein the common mode feedback amplifier includes a common mode input connected to the bias circuit.

8. The power detection circuit of claim 1, wherein, to generate the bias signal, the bias circuit is configured to generate the bias signal such that a conversion gain of the multiplier circuit is substantially constant regardless of variations in process and temperature.

9. The power detection circuit of claim 1, wherein:
the multiplier circuit includes a plurality of matched transistors; and
the bias circuit includes a first transistor that is scaled with respect to the plurality of matched transistors.

10. The power detection circuit of claim 9, wherein:
the plurality of transistors includes a first transistor, a second transistor, a third transistor and a fourth transistor;
the bias signal and a first polarity of the first differential input signal are input to respective control terminals of the first transistor and the fourth transistor; and
the bias signal and a second polarity of the first differential input signal are input to respective control terminals of the second transistor and the third transistor.

11. The power detection circuit of claim 10, wherein:
a first polarity of the second differential input signal is input to first terminals of the first transistor and the second transistor; and
a second polarity of the second differential input signal is input to first terminals of the third transistor and the fourth transistor.

12. The power detection circuit of claim 9, further comprising:
a first resistance; and
a second resistance,
wherein
the plurality of transistors includes a first transistor, a second transistor, a third transistor and a fourth transistor,
respective terminals of the first transistor and the third transistor are in communication with a non-inverting input of the differential amplifier and a first end of the first resistance, and
respective terminals of the second transistor and the fourth transistor are in communication with an inverting input of the differential amplifier and a first end of the second resistance.

13. The power detection circuit of claim 1, further comprising:
a transconductance amplifier configured to (i) receive the first differential input signal and (ii) output the second differential input signal to the multiplier circuit.

14. The power detection circuit of claim 1, wherein the bias circuit is configured to generate the bias signal based on a constant reference current provided to the bias circuit.

15. A radio frequency transmitter comprising the power detection circuit of claim 1.

16. A method for detecting an output power of a radio frequency transmitter, the method comprising:
multiplying a first differential input signal and a second differential input signal, wherein (i) the first differential input signal corresponds to a radio frequency signal to be amplified by an amplifier of the radio frequency transmitter and (ii) the second differential signal corresponds to an output signal as amplified by an amplifier of the radio frequency transmitter;
generating a bias signal; and
generating, based on (i) the bias signal and (ii) the first differential signal and the second differential signal as multiplied, an indication of the output power of the amplifier of the radio frequency transmitter.

17. The method of claim 16, wherein:
multiplying the first differential input signal and the second differential input signal includes using a multiplier circuit comprising a plurality of transistors; and
generating the bias signal includes generating the bias signal further based on a voltage threshold of one of the plurality of transistors.

18. The method of claim 16, wherein generating the bias signal includes generating the bias signal further based on a product of (i) a constant reference current and (ii) a bias resistance.

19. The method of claim 16, wherein generating the bias signal includes generating the bias signal such that a conversion gain associated with a power detection circuit is substantially constant regardless of variations in one or more of process and temperature.

* * * * *